United States Patent
Cho et al.

(10) Patent No.: US 7,943,290 B2
(45) Date of Patent: May 17, 2011

(54) METHOD OF FORMING FINE PATTERN USING AZOBENZENE-FUNCTIONALIZED POLYMER AND METHOD OF MANUFACTURING NITRIDE-BASED SEMICONDUCTOR LIGHT EMITTING DEVICE USING THE METHOD OF FORMING FINE PATTERN

(75) Inventors: Jae-hee Cho, Yongin-si (KR); Cheol-soo Sone, Yongin-si (KR); Dong-yu Kim, Gwangju-si (KR); Hyun-gi Hong, Gwangju-si (KR); Seok-soon Kim, Gwangju-si (KR)

(73) Assignee: Samsung LED Co., Ltd. (KR)

( * ) Notice: Subject to any disclaimer, the term of this patent is extended or adjusted under 35 U.S.C. 154(b) by 0 days.

(21) Appl. No.: 11/683,096

(22) Filed: Mar. 7, 2007

(65) Prior Publication Data

US 2007/0262300 A1   Nov. 15, 2007

(30) Foreign Application Priority Data

May 11, 2006 (KR) .................... 10-2006-0042385

(51) Int. Cl.
    *G03F 7/26* (2006.01)
(52) U.S. Cl. ........................... 430/329; 430/313
(58) Field of Classification Search ........... 430/270.1, 430/311, 313, 321, 310, 330, 325, 328, 329
    See application file for complete search history.

(56) References Cited

U.S. PATENT DOCUMENTS

| 3,734,844 | A * | 5/1973 | Sayigh et al. | 430/553 |
| 3,786,542 | A * | 1/1974 | Linder | 445/50 |
| 4,152,751 | A * | 5/1979 | Sindlinger et al. | 362/13 |
| 5,672,760 | A * | 9/1997 | Burns et al. | 564/440 |
| 6,107,202 | A * | 8/2000 | Chiu et al. | 438/690 |
| 6,599,665 | B1 * | 7/2003 | Lin et al. | 430/5 |
| 2005/0052878 | A1 * | 3/2005 | Yamada et al. | 362/460 |
| 2005/0133807 | A1 * | 6/2005 | Park et al. | 257/99 |
| 2007/0269918 | A1 * | 11/2007 | Cho et al. | 438/32 |

FOREIGN PATENT DOCUMENTS

| KR | 10-2003-0082295 | * 10/2003 |
| WO | WO 01/50508 | * 7/2001 |

* cited by examiner

*Primary Examiner* — Cynthia H Kelly
*Assistant Examiner* — Anca Eoff
(74) *Attorney, Agent, or Firm* — Cantor Colburn LLP

(57) ABSTRACT

Provided is a method of forming a fine pattern having a pattern dimension of 1 μm or less, repeatedly with reproducibility. The method of forming the fine pattern includes: forming an azobenzene-functionalized polymer film on an etched layer; irradiating the azobenzene-functionalized polymer film using an interference laser beam to form a patterned azobenzene-functionalized polymer film having fine-patterned surface relief gratings by a photophysical mass transporting of the azobenzene-functionalized polymer; etching the etched layer using the azobenzene-functionalized polymer film having the surface relief grating patterns as an etching mask; and removing the patterned azobenzene-functionalized polymer film.

18 Claims, 16 Drawing Sheets

FIG. 4C-a

FIG. 4C-b
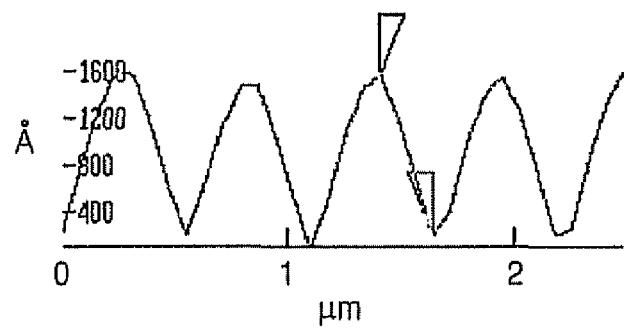
FIG. 4D
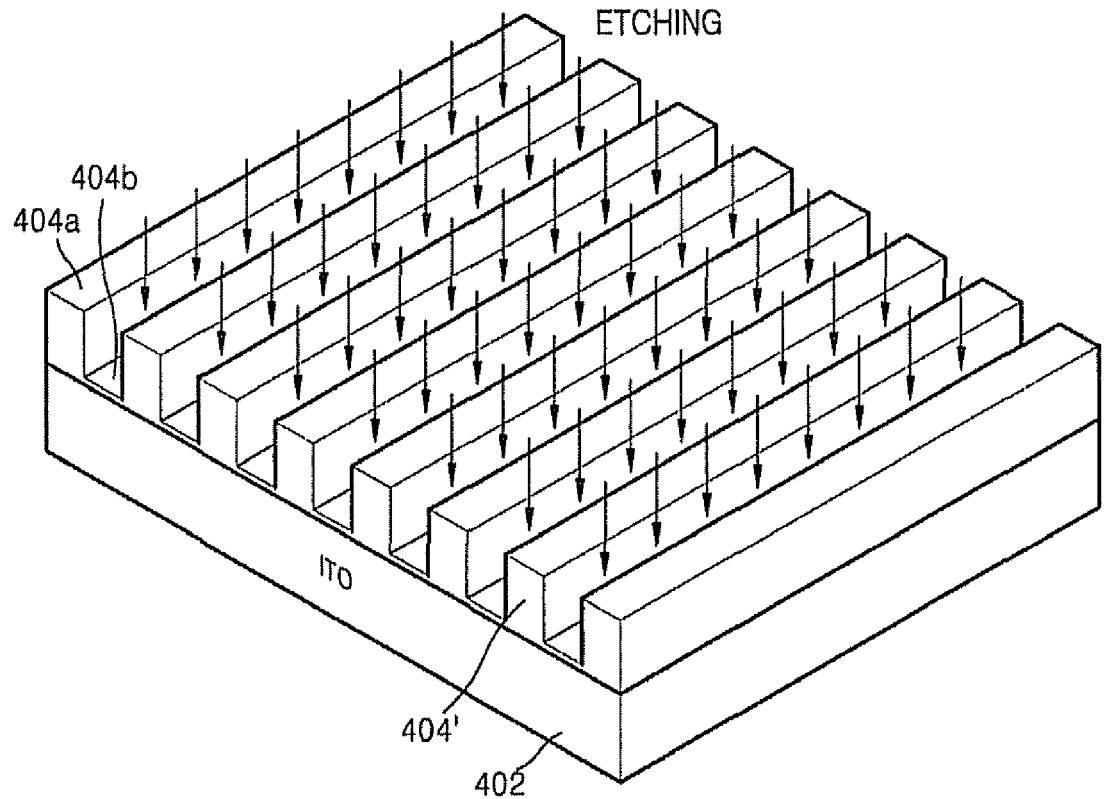

FIG. 4G-a

FIG. 4G-b
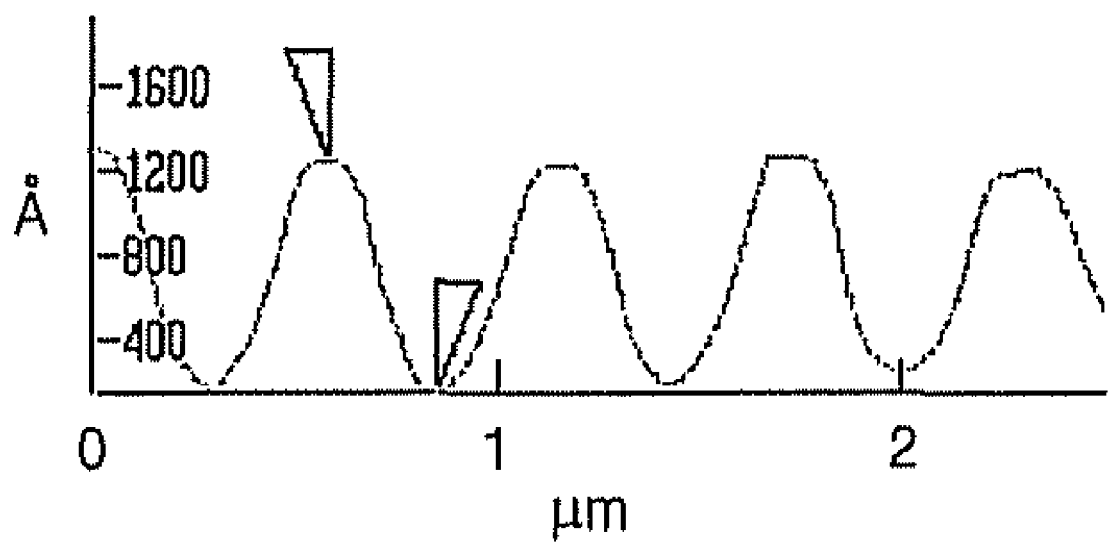

FIG. 6H-a

FIG. 6H-b
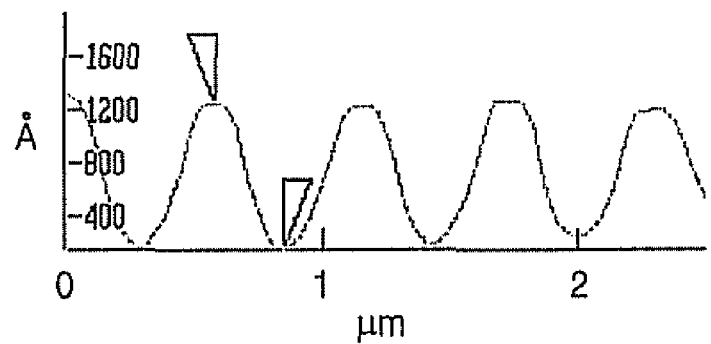
FIG. 7
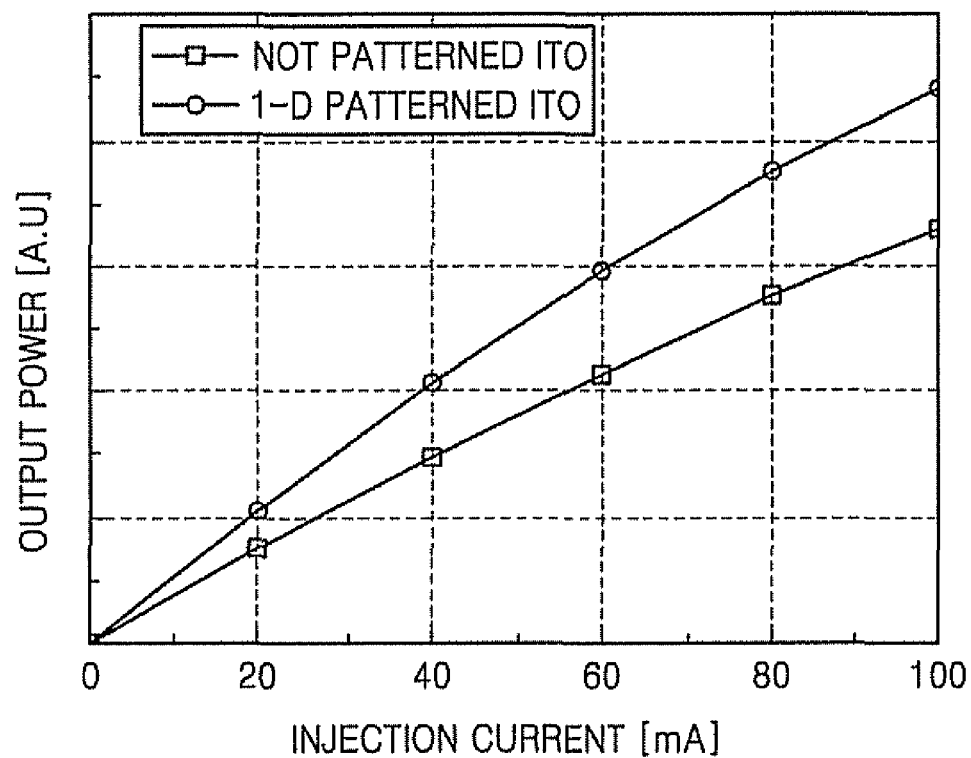

METHOD OF FORMING FINE PATTERN USING AZOBENZENE-FUNCTIONALIZED POLYMER AND METHOD OF MANUFACTURING NITRIDE-BASED SEMICONDUCTOR LIGHT EMITTING DEVICE USING THE METHOD OF FORMING FINE PATTERN

This application claims priority to Korean Patent Application No. 10-2006-0042385, filed on May 11, 2006, and all the benefits accruing therefrom under 35 USC § 119(a), the content of which is incorporated herein by reference in its entirety.

BACKGROUND OF THE INVENTION

1. Field of the Invention

The present invention relates to a method of forming a pattern, and more particularly, to a method of forming a fine pattern, in which a nanopattern having a pattern dimension of 1 μm or less can be repeatedly reproduced, simply and easily, and to a method of manufacturing a nitride-based semiconductor light emitting device using the method of forming a fine pattern.

2. Description of the Related Art

A method of forming a pattern using a conventional light lithographic method such as, for example, g-Line lithography using light having a wavelength of 436 nm, i-line lithography using ultraviolet ("UV") light at a wavelength of 365 nm, or deep-UV lithography using light having imaging wavelengths of 248 nm or 193 nm, includes multilevel operations such as forming a photoresist layer on a substrate, a soft baking process, a develop process and so on. Since the method uses light, it is difficult to form a pattern having a pattern dimension of 1 μm or less. Accordingly, various nano-patterning methods have been introduced. Among these, the two most promising methods at present are Extreme ultraviolet ("EUV") lithography and Electron beam lithography.

EUV lithography is an imaging method using very short wavelength ultraviolet light of e.g., 11-14 nm, which may be used to form a fine patterned surface relief grating on a substrate. EUV lithography uses conceptually similar equipment for effecting the imaging as those used in conventional light lithographic methods as described hereinabove are also used in EUV lithography. However, a mask and a lens as used in conventional light lithographic methods are not useful in EUV lithography due to the smaller feature sizes which require improved mask technology, and the high absorbance of conventional lens materials at EUV wavelengths. Accordingly, in place of a lens, EUV lithography uses reflective optics based on higher-order reflective materials (such as, e.g., molybdenum silicide layered reflective lenses), and consequently the optics used in EUV lithography are not trivial in their construction or necessarily small-sized.

Electron beam ("e-beam") lithography is another method in which a pattern is formed by irradiating an electron beam directly on a substrate. A finer pattern can be formed by e-beam lithography when compared with that obtained using EUV lithography. However, since Electron beam lithography has increased manufacturing costs and is difficult to achieve accurate results, Electron beam lithography is not commonly used in a method of manufacturing an element.

In addition to the methods described above, other non-optical or irradiative methods have been examined such as, for example, a Nano imprint method in which a pattern is formed using a nano-size mold, a self-assembly method using self-assemble properties of the molecules; a molecular or atomic manipulation in which a pattern is formed by manipulating directly a molecule or an atom; or the like. However, for these methods of forming patterns, materials used are limited and reproducibility is poor. In particular, it is difficult to form a pattern having a pattern dimension of 1 μm or less.

BRIEF SUMMARY OF THE INVENTION

In view of the foregoing deficiencies of the prior art, the present invention provides a method of forming a fine pattern, in which a nanopattern having a pattern dimension 1 μm or less can be repeatedly reproduced, simply and easily on a substrate, and a method of manufacturing a nitride-based semiconductor light emitting device using the method of forming a fine pattern.

In an embodiment, there is provided a method of forming fine pattern including: forming an azobenzene-functionalized polymer film on an etch layer; irradiating the azobenzene-functionalized polymer film with an interference laser beam to form a patterned azobenzene-functionalized polymer film having fine patterned surface relief gratings by a photophysical mass transporting of the azobenzene-functionalized polymer; etching the etch layer where the azobenzene-functionalized polymer film is an etching mask; and removing the azobenzene-functionalized polymer film.

In another embodiment, there is provided a method of manufacturing nitride-based semiconductor light emitting device including an n-doped semiconductor layer, an active layer, a p-doped semiconductor layer, an n-electrode and a p-electrode, the method including; forming an azobenzene-functionalized polymer film in an etch layer, wherein the etch layer is selected from the group consisting of the n-doped semiconductor layer, the p-doped semiconductor layer, the n-electrode, and the p-electrode; irradiating the azobenzene-functionalized polymer film with an interference laser beam to form a patterned azobenzene-functionalized polymer film having fine patterned surface relief gratings by a photophysical mass transporting of the azobenzene-functionalized polymer; forming an uneven plane having a photonic crystal structure by etching the etch layer where the patterned azobenzene-functionalized polymer film on which the fine patterned surface relief gratings are formed, is an etching mask; and removing the azobenzene-functionalized polymer film.

In another embodiment, a method of forming a fine pattern having a pattern dimension of 1 μm or less can be reproduced repeatedly using the method. In addition, when the nitride-based semiconductor light-emitting device is manufactured using the method of forming a fine pattern, a photonic crystal structure having improved optical power and light extraction efficiency is obtained.

BRIEF DESCRIPTION OF THE DRAWINGS

The above and other features and advantages of the present invention will become more apparent by describing in detail exemplary embodiments thereof with reference to the attached drawings in which:

FIGS. 4A through 4G are views illustrating an exemplary method of forming a fine pattern, according to an embodiment;

FIG. 7 is a graph illustrating output power according to injection current in an exemplary nitride-based semiconductor light-emitting device manufactured using the method illustrated in FIGS. 6A through 6H.

DETAILED DESCRIPTION OF THE INVENTION

Figure 1:
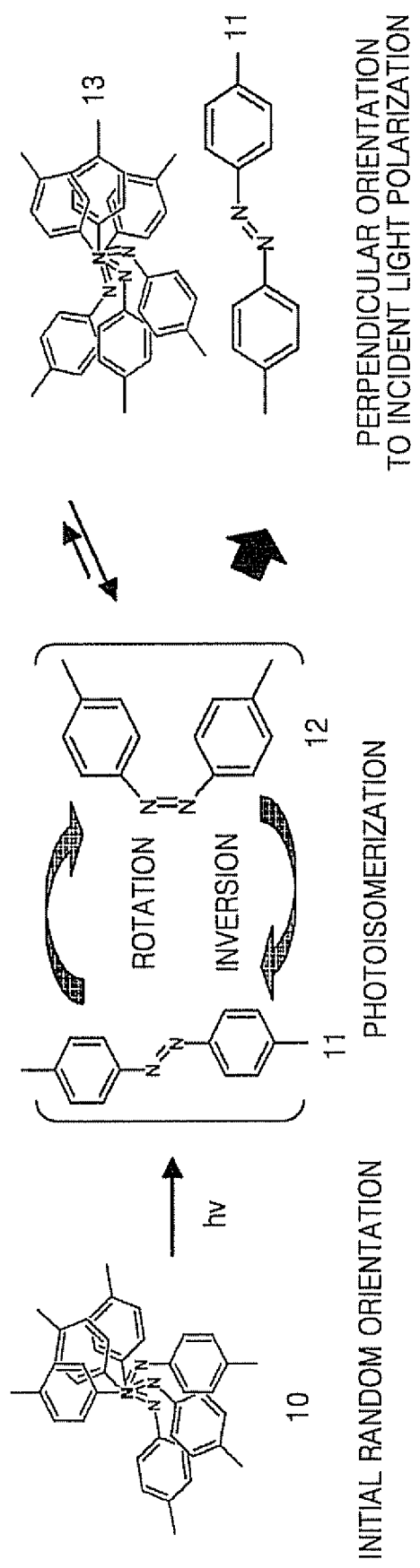
FIG. 1 is a schematic view illustrating an exemplary photoisomerization reaction of an azobenzene-functionalized polymer, according to an embodiment.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and region are exaggerated for clarity.

It will be understood that when an element is referred to as being "on" another element, it can be directly on the other element or intervening elements may be present therebetween. In contrast, when an element is referred to as being "disposed on" another element, the elements are understood to be in at least partial contact with each other, unless otherwise specified.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
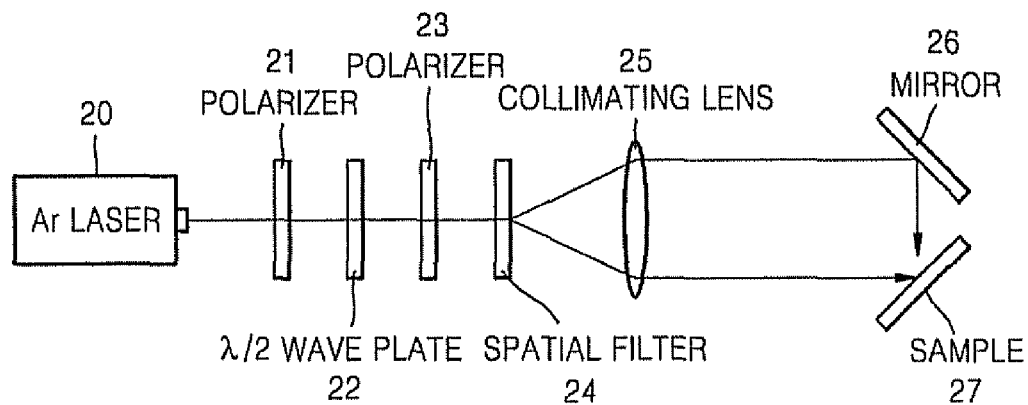
FIG. 2 is a schematic view illustrating an exemplary optical device for irradiating an interference laser beam onto an azobenzene-functionalized polymer, according to an embodiment.
Figure 3:
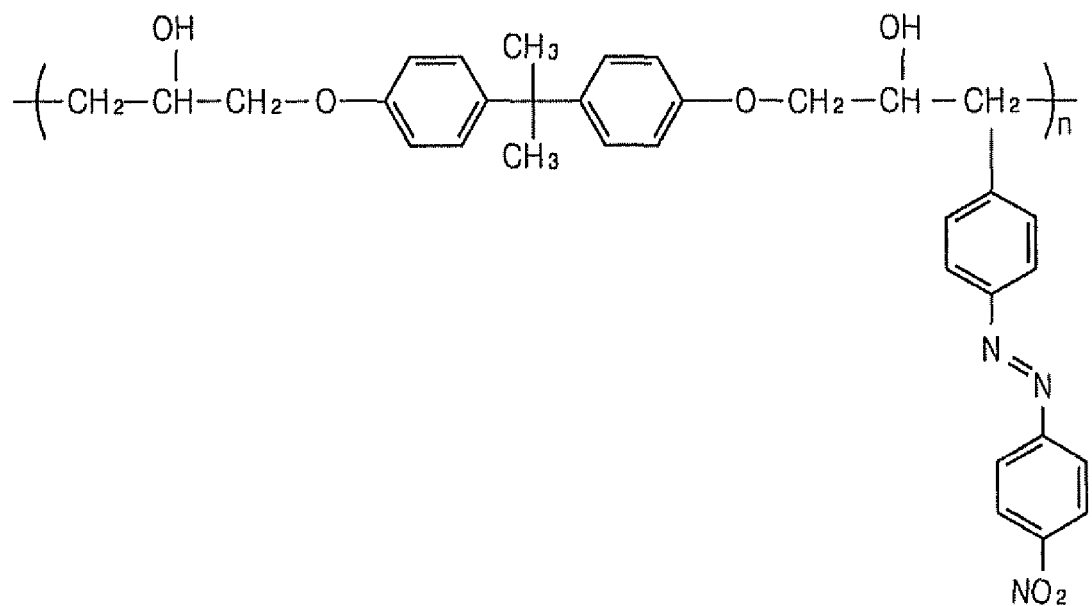
FIG. 3 is a structural formula of Poly Disperse Orange 3 (PDO3) constituting an exemplary azobenzene-functionalized polymer, according to an embodiment.

FIG. 1 is a schematic view illustrating a photoisomerization reaction of an azobenzene-functionalized polymer according to an embodiment of the present invention, FIG. 2 is a schematic view illustrating an optical device for irradiating an interference laser beam onto an azobenzene-functionalized polymer according to an embodiment, and FIG. 3 is a structural formula of Poly Disperse Orange 3 (PDO3) constituting an azobenzene-functionalized polymer according to an embodiment.

Referring to FIG. 1, properties of the azobenzene-functionalized polymer used in an embodiment are described in detail as follows. An azobenzene functionality is an isomerizable structure (interchangeably a bent "Z" isomer structure 12 to a liner "E" isomer structure 11) in which the two benzene functionalities are connected by two doubly bonded nitrogen atoms, and is an aromatic compound in which electrons are delocalized i.e., are distributed across an entire molecule by a side-overlapping of p-orbitals. It is well known that the azobenzene-functionalized polymer has a perpendicular orientation to incident light, providing a polarization property for the azobenzene-functionalized polymer. Here, the perpendicular orientation to incident light polarization is follows. When the azobenzene-functionalized polymer 10 with an initial random orientation of the azobenzene functional groups is exposed to linear-polarized light, it isomerizes by inversion to the linear E isomer 11 from the Z isomer 12 (or by rotation from the E isomer 11 to the Z isomer 12 from random azobenzene-functionalized polymer 13) and is oriented perpendicular to the direction of the linear-polarization of incident light shown in E isomer 11. Based on the perpendicular orientation to incident light polarization property, when an interference laser beam is irradiated onto a surface of the azobenzene-functionalized polymer film, a photophysical mass transporting of the azobenzene-functionalized polymer attributable to the change in dimension and volume of the azobenzene functional groups which in turn causes a change in volume in the irradiated areas, can be induced thereby, and thus form a relief pattern in the exposed areas. As a result, surface relief gratings having a fine pattern can be formed at the surface of the azobenzene-functionalized polymer film.

Materials having a weight averaged molecular weight (Mw) in the range of thousands thorough hundreds of thousands may be used as the azobenzene-functionalized polymer. The greater the molecular weight of the materials, the more photophysical properties of the materials on exposure light are slowed. Accordingly, to control photophysical properties, materials having a weight averaged molecular weight of 1,000 to 500,000 g/mol can be used. For example, an organic glass comprising a polymer with azobenzene functionality and having a small amount of entangled chains can readily isomerize to provide desired photophysical properties on exposure to light of an appropriate wavelength, and the surface relief gratings may thereby be formed rapidly. Referring to FIG. 2, the 488 nm emission line from an Ar laser 20 is used as a light source in the optical device for irradiating an interference laser beam. Linear-polarized light passes through a $\lambda/2$ wave plate 22 while being p-polarized through polarizers 21 and 23, passes through a spatial filter 24 and a collimating lens 25 in that order, and arrives at a sample 27. Here, some of parallel polarized light passed through the collimating lens arrives at the sample directly. The rest of the parallel light is reflected on a surface of a mirror 26 to arrive at the sample. Here, optical materials for forming the $\lambda/2$ wave plate 22 may only allow planes of p-polarization and linear-polarization to be rotated in the range of 0 through 90°. When optical materials having this property are used, the surface relief gratings may be formed more effectively. When an exposing operation is performed repeatedly while rotating a substrate (i.e., sample 27) having an azobenzene-functionalized polymer disposed thereon around an axis coincident with the irradiating direction of the interference laser beam, the surface relief gratings having various shapes such as a two dimensional ("2-D") pattern or a three dimensional ("3-D") pattern can be achieved.

FIGS. 4A through 4G are views illustrating a method of forming a fine pattern according to an embodiment.

Figure 4A:
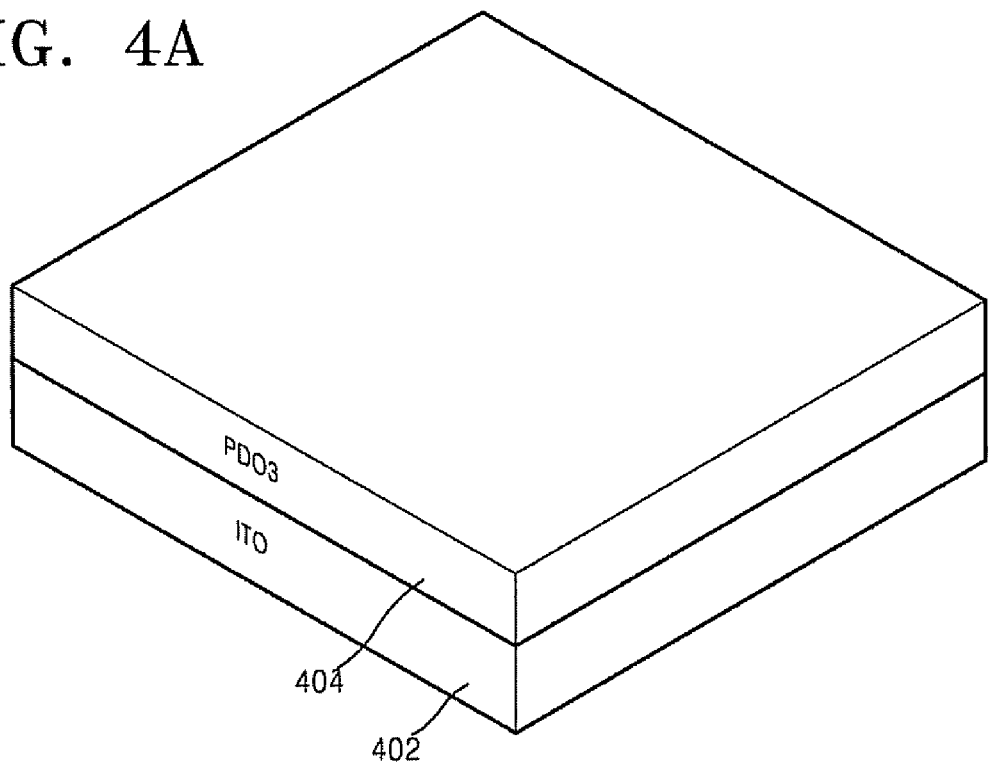
Figure 4B:
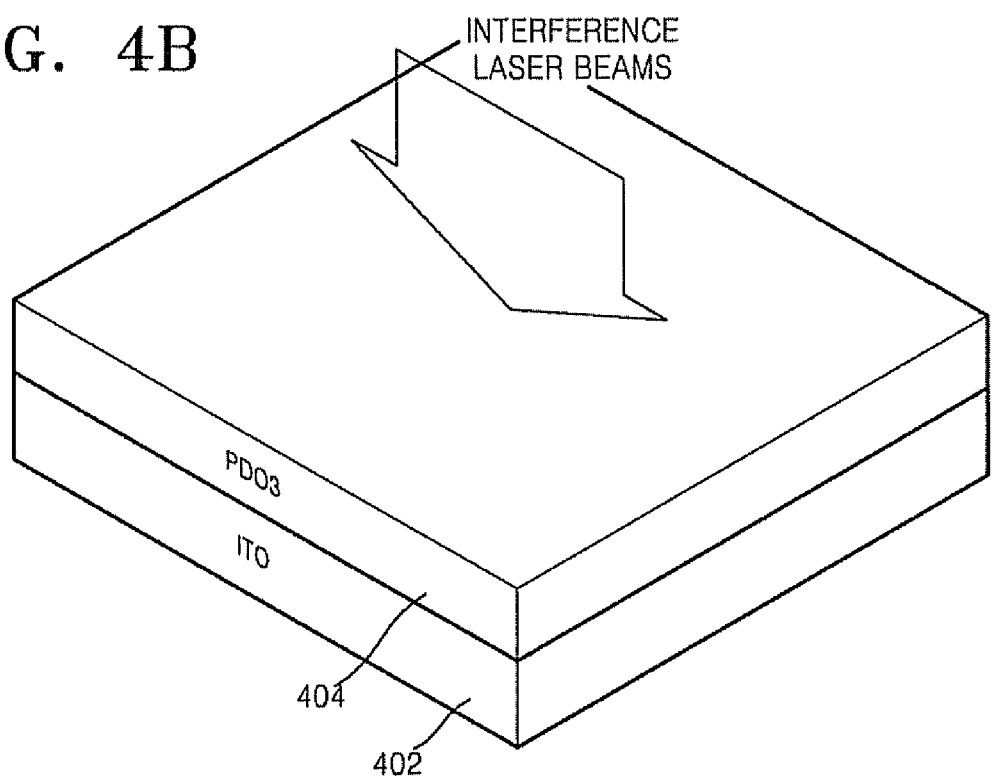
Figure 4C:
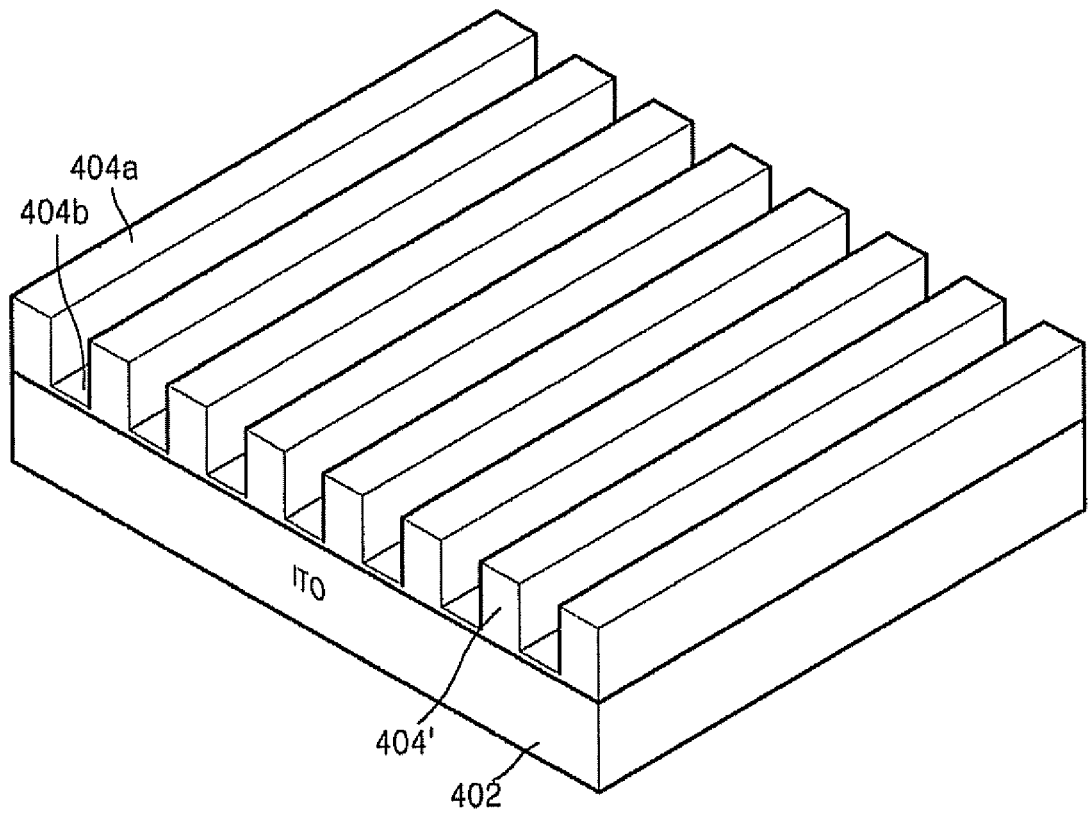
Figure 4C:
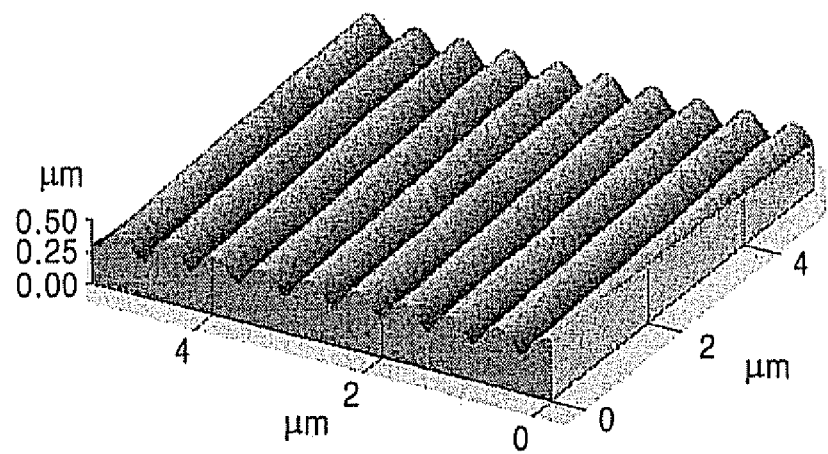

Referring to FIGS. 4A through 4C, after preparing an etch layer 402 for a fine patters to be formed thereon, an azobenzene-functionalized polymer, for example, Poly Disperse Orange 3 ("PDO3") (FIG. 3) is coated on the etch layer 402 to form an azobenzene-functionalized polymer film 404 (FIG. 4A).

To coat the azobenzene-functionalized polymer, a spin coating method is generally used, but other coating methods may be used. The etch layer 402 may be a substrate formed of one or more of various materials. For example, the etched layer 402 may be formed of Indium Tin Oxide ("ITO") or Fluorine-doped Tin Oxide ("FTO"), but are not limited thereto.

Next in FIG. 4B, by irradiating an interference laser beam 400 onto the azobenzene-functionalized polymer film 404 using the optical device of FIG. 2, a patterned azobenzene-functionalized polymer film 404' having fine patterned surface relief gratings are formed according to a mass transporting of the azobenzene-functionalized polymer. Referring to FIG. 4C, the surface relief gratings include protrusions 404a and uneven gaps 404b. In addition, FIG. 4C-a (perspective view) and 4C-b (cross-sectional view) of an Atomic Force Microscopy (AFM) micrograph illustrates the surface relief gratings (i.e., protrusions 404a and gaps 404b) formed by the etch process. The fine pattern can have a pattern dimension (i.e., line width for the protrusions 404a or gap width for the gaps 404b, measured orthogonal to the long dimension of the pattern) of several tens through thousands of nanometers such as, in an embodiment, 2 μm or less. In a specific embodiment, the protrusions 404a and gaps 404b have pattern dimensions of 1 μm or less. In another embodiment, the pattern dimensions for the protrusions and/or gaps is 10 nm or greater. The period (i.e., peak-to-peak dimension of the protrusions 404a, or trough-to-trough dimension of the gaps 404b) of the fine pattern can be 10 μm or less. Similarly, in an embodiment, the period of the pattern is 20 nm or greater. Here, when an exposing operation is performed repeatedly while rotating the azobenzene-functionalized polymer film 404 (in FIG. 4B) around the interference laser beam as an axis, the surface relief gratings 404' having various shapes such as a 1-D pattern, a 2-D pattern or 3-D pattern can be obtained.

Figure 4E:
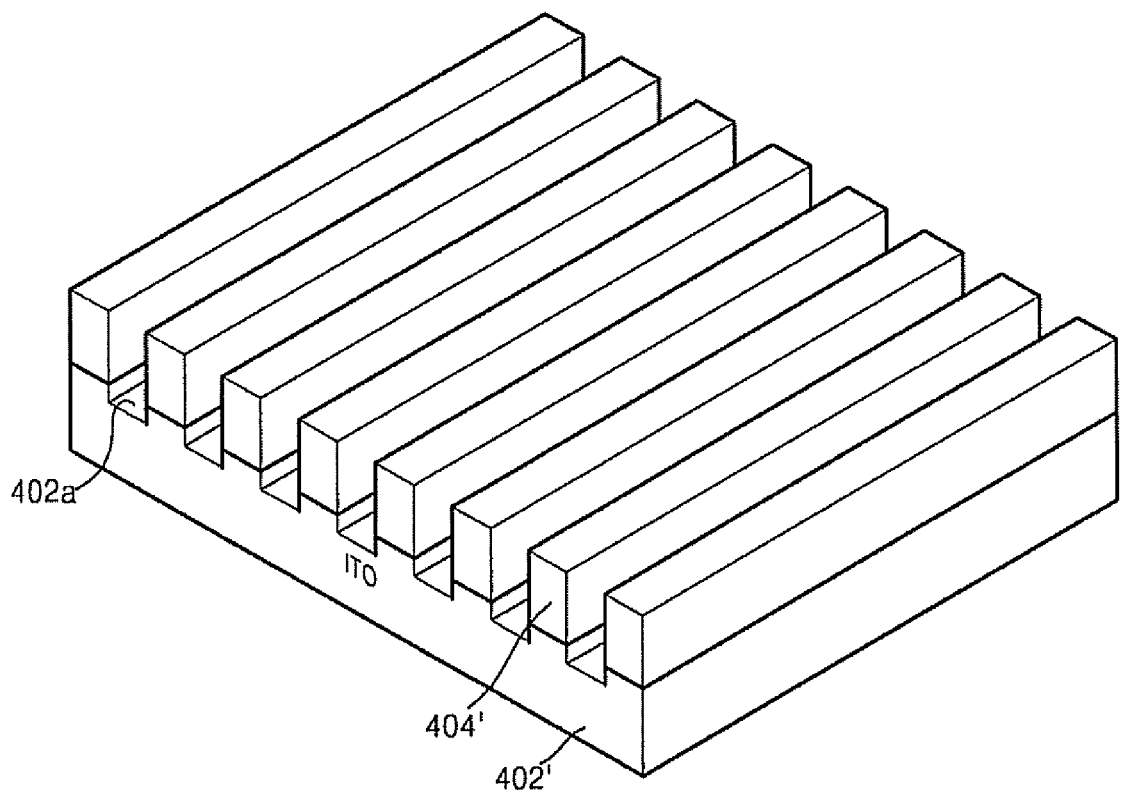

Referring to FIGS. 4D and 4E, the etch layer 402 is etched as shown in FIG. 4D to a predetermined depth using the patterned azobenzene-functionalized polymer film 404' of the surface relief gratings as an etching mask. In particular, the protrusions 404a of the surface relief gratings 404' serve as the etching mask. Nanopatterns 402a (In FIG. 4E) may be formed in the form of the uneven gaps 404b on the etch layer 402. Accordingly, the fine pattern is formed on the etch layer 402 in the range of several tens through thousands of nanometers, preferably, 1 μm or less. Throughout this specification, nanopatterns formed on exposed (i.e., "upper") surfaces of the etch layer 402 are called "fine pattern", "patterned", or "patterning".

The above etching includes methods such as dry etching, wet etching, and the like. In particular, an Inductively Coupled Plasma ("ICP") etching method, a Reactive Ion Etching ("RIE") etching method, or the like may be used. In the dry etching, at least one selected from the group consisting of methane gas, a halogen gas, a tetrafluoromethane gas, or a combination thereof, are used as a source gas. Where a combination is used, the mixing ratio of these gases can be readily determined by one skilled in the art as appropriate.

Figure 4F:
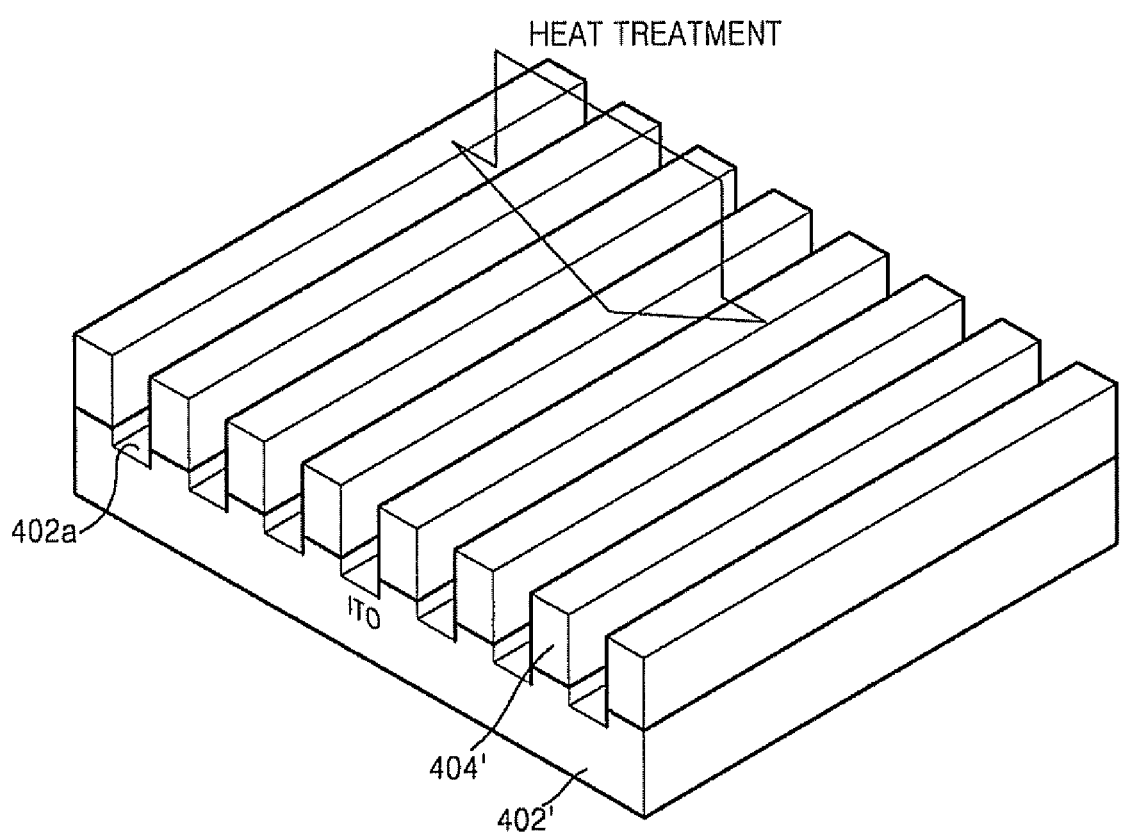
Figure 4G:
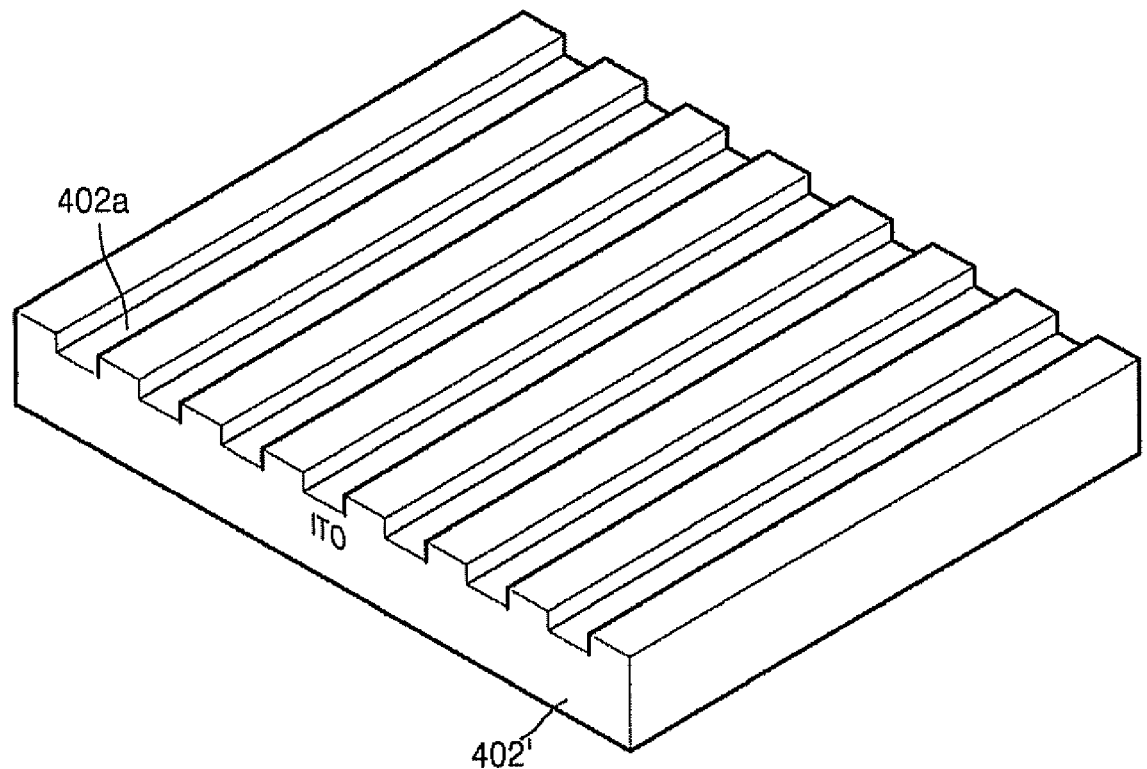
Figure 4G:
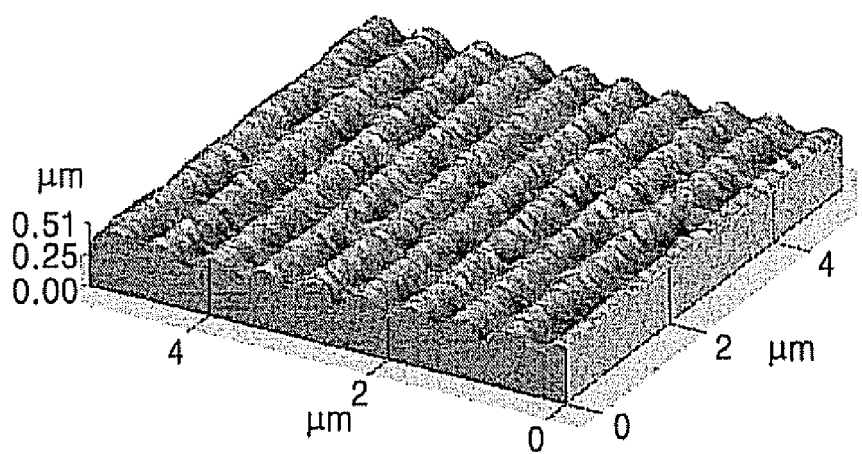

Referring to FIGS. 4F and 4G, the resulting substrate is heat-treated at a temperature between ambient temperature and 425° C. to decompose or remove the patterned azobenzene-functionalized polymer film 404'. The heat treatment may be performed for 1 to 12 hours, or alternatively, may include multilevel operations (i.e., combinations of temperature ramp increases, followed by holds at the target temperatures). In an embodiment, the heat treatment can include: raising the temperature from ambient temperature to 100° C. over 30 minutes to maintain for one hour; raising a temperature from 100° C. to 350° C. over 30 minutes and maintaining for 5 hours; and raising a temperature from 300° C. to 425° C. over 30 minutes and maintaining for 2 hours. The heat treatment, including the multilevel operations, can minimize thermal damage in the patterned etch layer 402'.

Figure 5:
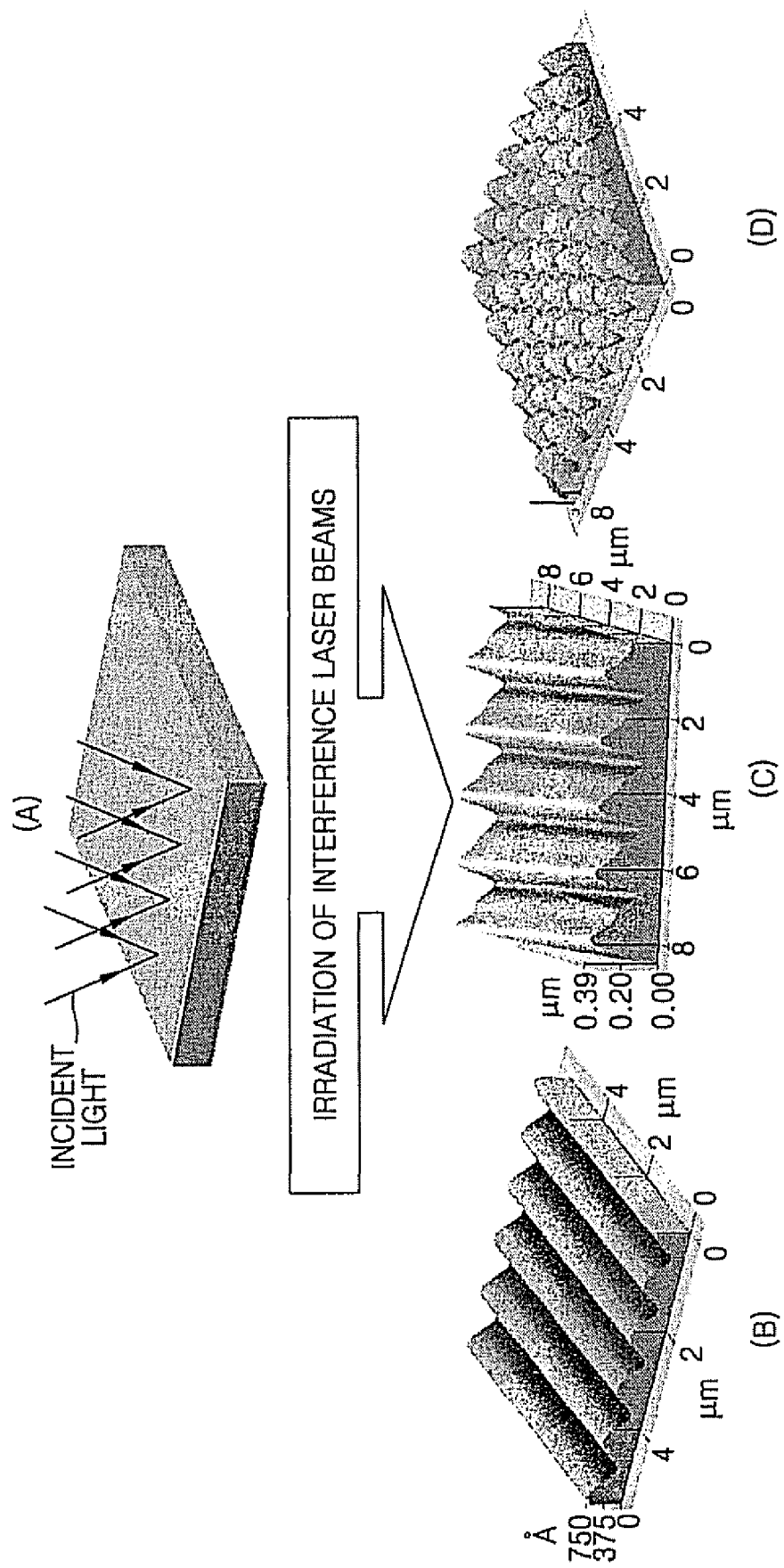
FIG. 5 is an Atomic force Microscopy ("AFM") photograph of exemplary surface relief gratings, which have various shapes and are formed on the azobenzene-functionalized polymer by irradiating an interference laser beam of FIG. 4C, according to an embodiment.

Using the method illustrated in FIGS. 4A through 4G, the nanopatterns 402a having a pattern dimension of 1 μm or less can be easily formed on the etch layer 402 (FIGS. 4A-4D) to show the patterned etch layer 402' (FIGS. 4E-4G). The patterned azobenzene-functionalized polymer film 404' is removed by, e.g., a thermal decomposition process, to provide a surface having only patterned etch layer 402'. The method as described is simple and facile, and can be performed repeatedly. Thus, when the method is used for fabricating an element, the method has improved reliability over conventional imaging and etching processes. FIGS. 4G-a and 4G-b also illustrate an AFM micrograph of the nanopatterns 402a in perspective (FIG. 4G-a) and in cross-section (FIG. 4G-b). FIG. 5 is an AFM micrograph of the surface relief gratings of the patterned azobenzene-functionalized polymer film 404', which have various shapes and are formed by irradiating using the interference laser beam and etching as shown in FIGS. 4B-4G, according to an embodiment.

EXAMPLE

Formation of a Fine Pattern

Copolymer PDO3 (referring to FIG. 3) was employed as the azobenzene-functionalized polymer. A solution, in which PDO3 was dissolved in cyclohexanone, was spin-coated on a substrate having an ITO layer deposited on a surface thereof to form a resulting layer having a thickness of 500 μm. The resulting layer was dried in a vacuum oven to remove the cyclohexanone organic solvent from the resulting layer at a temperature of 100° C. to form a PDO3 film. The PDO3 film was exposed using the optical device of FIG. 2 where the Ar laser is operating at a wavelength of 488 nm for one hour to form the surface relief gratings on the PDO3 film. Next, the ITO layer was etched using the patterned PDO3 film of the surface relief gratings as the etching mask. To etch the ITO layer, an ICP etching method was used, and was performed at a power output of 1000 watts for 2 minutes. In the ICP etching method, Ar gas and methane ($CH_4$) gas in a volume ratio of 9:1 were mixed and used as the source gas. The resulting layer was heat-treated at a temperature between ambient temperature and 425° C. to remove the patterned azobenzene-functionalized polymer film. In particular, the heat treatment included: raising the temperature from ambient temperature to 100° C. over 30 minutes and maintaining for one hour; raising the temperature from 100° C. to 350° C. over 30 minutes and maintaining for 5 hours; and raising the temperature from 300° C. to 425° C. over 30 minutes and maintaining for 2 hours.

FIGS. 6A through 6H are views illustrating respective operations included in a method of manufacturing a nitride-based semiconductor light-emitting device according to an embodiment. The method of forming fine patterns in the Example can be used to manufacture the nitride-based semiconductor light-emitting device. In particular, the nitride-based semiconductor light-emitting device having a photonic crystal structure can be manufactured using the method of forming a fine pattern according to an embodiment. The nitride-based semiconductor light emitting device prepared according to the method according to the current embodiment and that includes the photonic crystal structure has improved optical power and light extraction efficiency in comparison with a conventional light-emitting device.

Figure 6A:
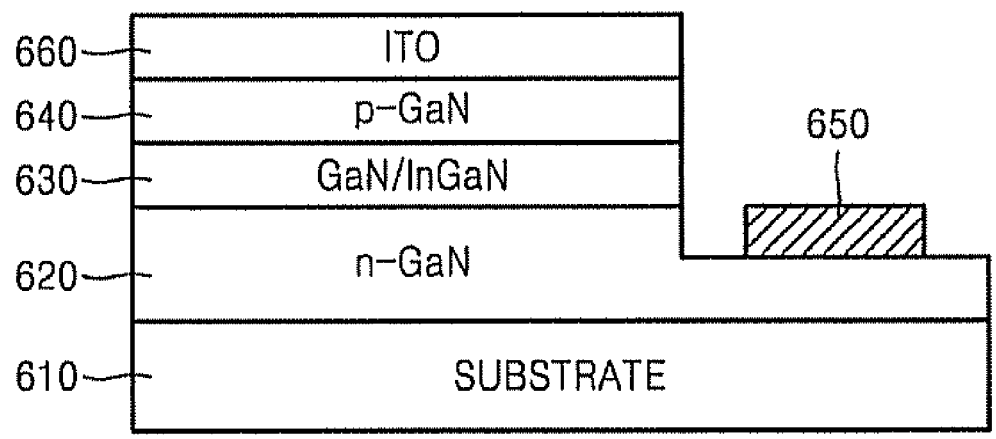
FIGS. 6A through 6H are views illustrating an exemplary method of manufacturing a nitride-based semiconductor light emitting device, according to an embodiment.
Figure 6B:
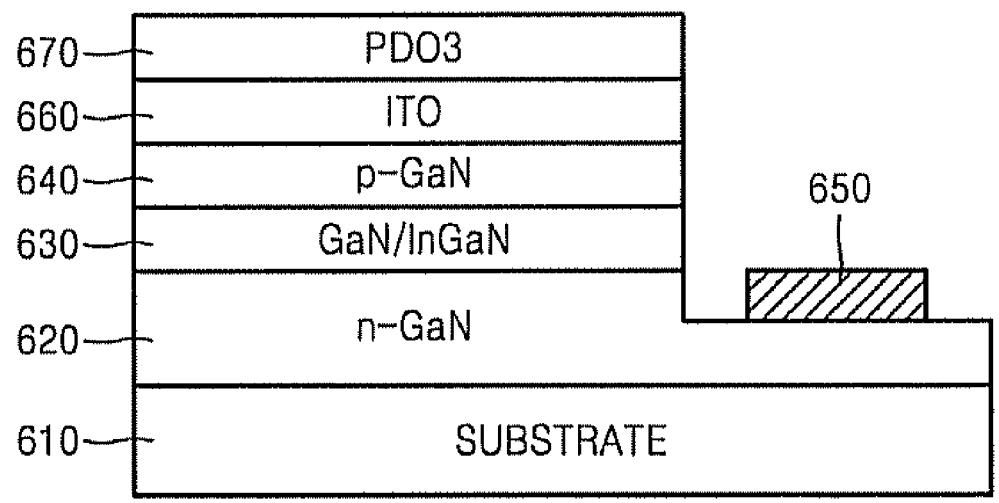

Referring to FIGS. 6A and 6B, in the method of manufacturing the nitride-based semiconductor light emitting device according to the current embodiment including a substrate 610, an n-doped semiconductor layer 620 disposed on a surface of substrate 610, an active layer 630 disposed on a surface of n-doped semiconductor layer 620 opposite substrate 610, a p-doped semiconductor layer 640 disposed on a surface of active layer 630 opposite n-doped semiconductor layer 620, an n-electrode 650 disposed on an exposed surface of n-doped semiconductor layer 620 and a p-electrode 660 disposed on a surface of p-doped semiconductor layer 640, an azobenzene-functionalized polymer film 670 is formed on an etch layer (i.e., p-electrode 660). The etched layer (p-electrode 660) is one layer selected from the group consisting of the n-doped semiconductor layer 620, the p-doped semiconductor layer 640, the n-electrode 650 and the p-electrode 660. In the method according to the current embodiment, the p-electrode 660 is the etch layer. In the method of manufacturing the nitride-based semiconductor-emitting device according to the current embodiment, the same descriptions as in the Example will be described in brief.

Referring to FIG. 6A, the n-doped semiconductor layer 620 is formed on a prepared substrate 610, for example, a Si, GaAs, SiC, GaN, or sapphire substrate using a same kind layer stack (for example, GaN-based crystal growth on a GaN substrate) or hetero layer stack (for example, GaN-based crystal growth on a sapphire substrate). The n-doped semiconductor layer 620 is formed of Group III-V AlInGaN-based nitride semiconductor materials, which may be formed into an n-GaN layer. Here, the n-doped semiconductor layer 620 may be formed using vapor deposition methods such as Halide or Hydride vapor phase epitaxy ("HVPE"), Metal Organic Chemical Vapor Deposition ("MOCVD"), Molecular Beam Epitaxy ("MBE"), Plasma Enhanced Chemical Vapor Deposition ("PECVD"), sputtering or evaporation. Since these methods are known to those of ordinary skill in the art, descriptions thereof will be omitted.

Next, the active layer 630 and the p-doped semiconductor layer 640 are stacked on the n-doped semiconductor layer 620 sequentially. Here, the active layer 630 and the p-doped semiconductor layer 640 are formed also using various vapor deposition methods such as HVPE, MOCVD or MBE.

The active layer 630 is formed of Group III-V $In_xAl_yGa_{1-x-y}N$ ($0 \leq x \leq 1$, $0 \leq y \leq 1$ and $0 \leq x+y \leq 1$) in GaN-based nitride semiconductor materials, which may be formed into a InGaN layer or a AlGaN layer. The active layer 630 may be formed to have a multi-quantum well ("MQW") structure or a single-quantum well structure, but the structure of the active layer 630 is not limited thereto. For example, the active layer 630 may be formed to have GaN/InGaN/GaN MQW or GaN/AlGaN/GaN MQW structures. The p-doped semiconductor layer 640 is formed of Group III-V p-GaN-based Nitride semiconductor materials, which may be formed into a p-GaN layer or a p-GaN/AlGaN layer.

Next, the resulting layers are etched from a predetermined region of the p-doped semiconductor layer 640 as a starting point into a predetermined depth of the n-doped semiconductor layer 620. The surface of the n-doped semiconductor layer 620 is etched. Then, the n-electrode 650 and the p-electrode 660 are formed on the etched surface of the n-doped semiconductor layer 620 and on the p-doped semiconductor layer 640 respectively. The n-electrode 650 or the p-electrode 660 may be formed of a conductive transparent oxide. The conductive transparent oxide may be one selected from the group consisting of Indium Tin Oxide (ITO), Zinc-doped Indium Tin Oxide ("ZITO"), Zinc Indium Oxide ("ZIO"), Gallium Indium Oxide ("GIO"), Zinc Tin Oxide ("ZTO"), Fluorine-doped Tin Oxide (FTO), Aluminum-doped Zinc Oxide ("AZO"), Gallium-doped Zinc Oxide ("GZO"), $In_4Sn_3O_{12}$ and Zinc Magnesium Oxide ($Zn_{1-x}Mg_xO$, $0 \leq x \leq 1$). More specific examples of the conductive transparent oxide are $Zn_2In_2O_5$, $GaInO_3$, $ZnSnO_3$, F-doped $SnO_2$, Al-doped ZnO, Ga-doped ZnO, MgO, ZnO, and the like. According to the current embodiment, the p-electrode 660 is formed of ITO.

Referring to FIG. 6B, when the p-electrode 660 formed of ITO is the etched layer, PDO3 is coated on the p-electrode 660 to form the azobenzene-functionalized polymer film 670. As described above, a spin coating method is generally used to form the azobenzene-functionalized polymer film 670, but other coating methods may be used. Materials having a weight-averaged molecular weight (Mw) in the range of thousands through hundreds of thousands may be used as the azobenzene-functionalized polymer of the azobenzene-functionalized polymer film 670.

Figure 6C:
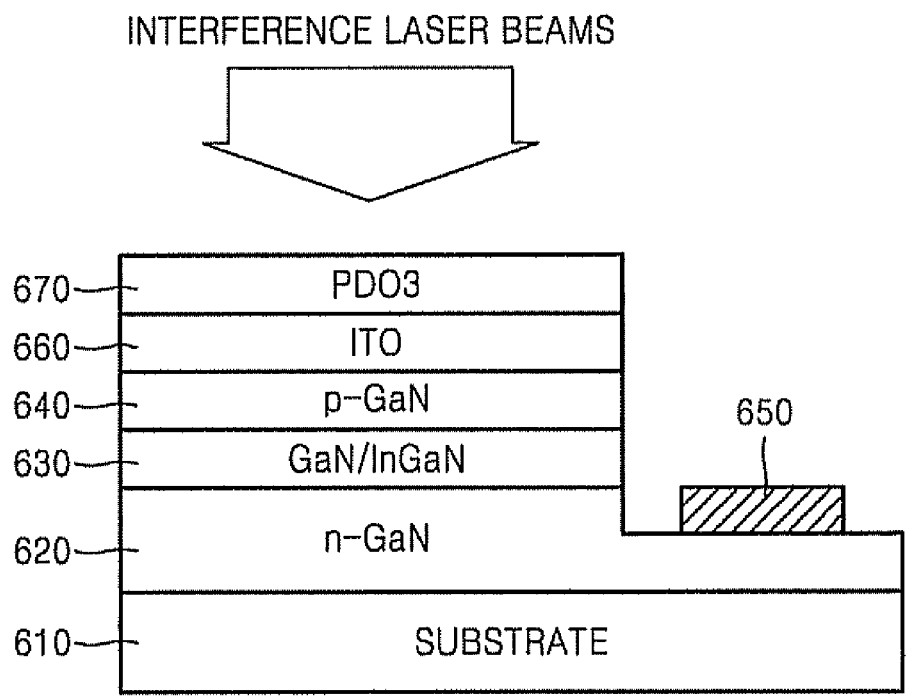
Figure 6D:
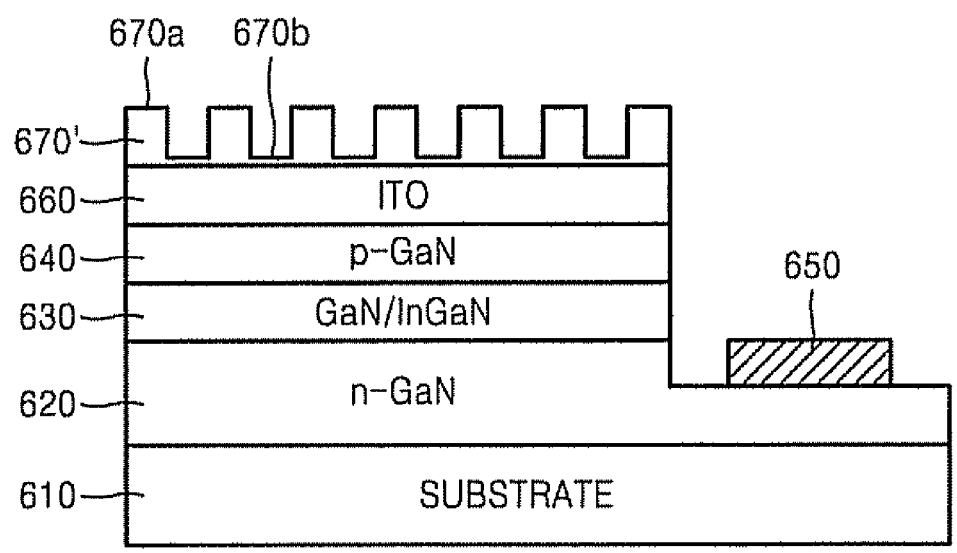

Referring to FIGS. 6C and 6D, fine-patterned surface relief gratings are formed on the azobenzene-functionalized polymer film 670 according to a photophysical mass transporting of the azobenzene-functionalized polymer by irradiating with an interference laser beam using the optical device of FIG. 2, thus forming patterned azobenzene-functionalized polymer film 670' (FIG. 6D). The fine-patterned surface relief gratings include protrusions 670a and even gaps 670b. The protrusions 670a and even gaps 670b are formed to have dimensions in the range of several tens through thousands of nanometers. In an embodiment, the protrusions 670a and gaps 670b have a cross-sectional dimension of 1 μm or less. The period of the protrusions 670a (from peak to peak) and even gaps 670b (from trough to trough) may be 10 μm or less. When the exposing operation (i.e., irradiation using interference laser beam) is repeated while rotating the substrate having the azobenzene-functionalized polymer film formed thereon, around the axis coincident with the irradiating direction of the interference laser beam, fine-patterned surface relief gratings can be formed with various shapes such as a 1-D (one dimension) pattern, a 2-D (two dimension) pattern or a 3-D (three dimension) pattern.

Figure 6E:
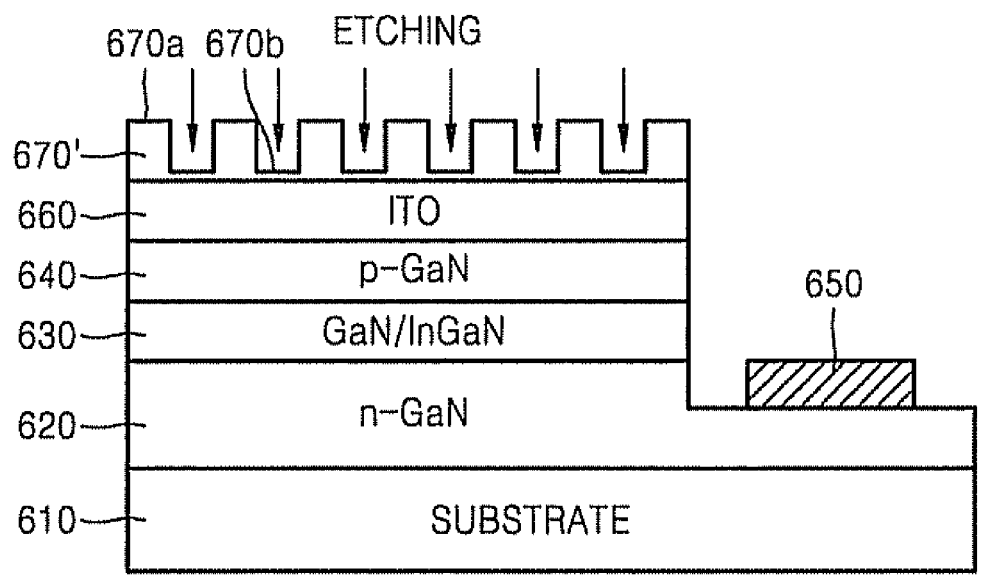
Figure 6F:
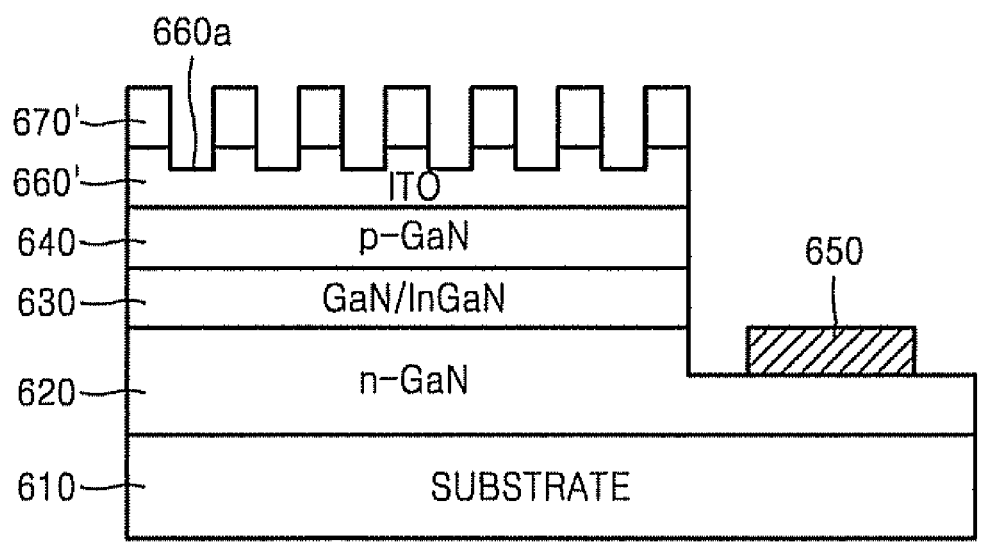

Referring to FIGS. 6E and 6F, by etching the ITO layer 660 using the patterned azobenzene-functionalized polymer film 670' as the etching mask of the fine patterned surface relief gratings, an uneven plane 660a having a photonic crystal structure is formed in the ITO layer 660 to form patterned ITO layer 660'. Light generated within the active layer 630 is diffracted and/or diffused by the uneven plane 660a having the photonic crystal structure, and thus external light extraction efficiency can be increased, and in particular total internal reflection of the light can be prevented. Accordingly, the output power and light extraction efficiency of the nitride-based semiconductor light emitting device can be improved in comparison with those of the conventional light emitting device.

Figure 6G:
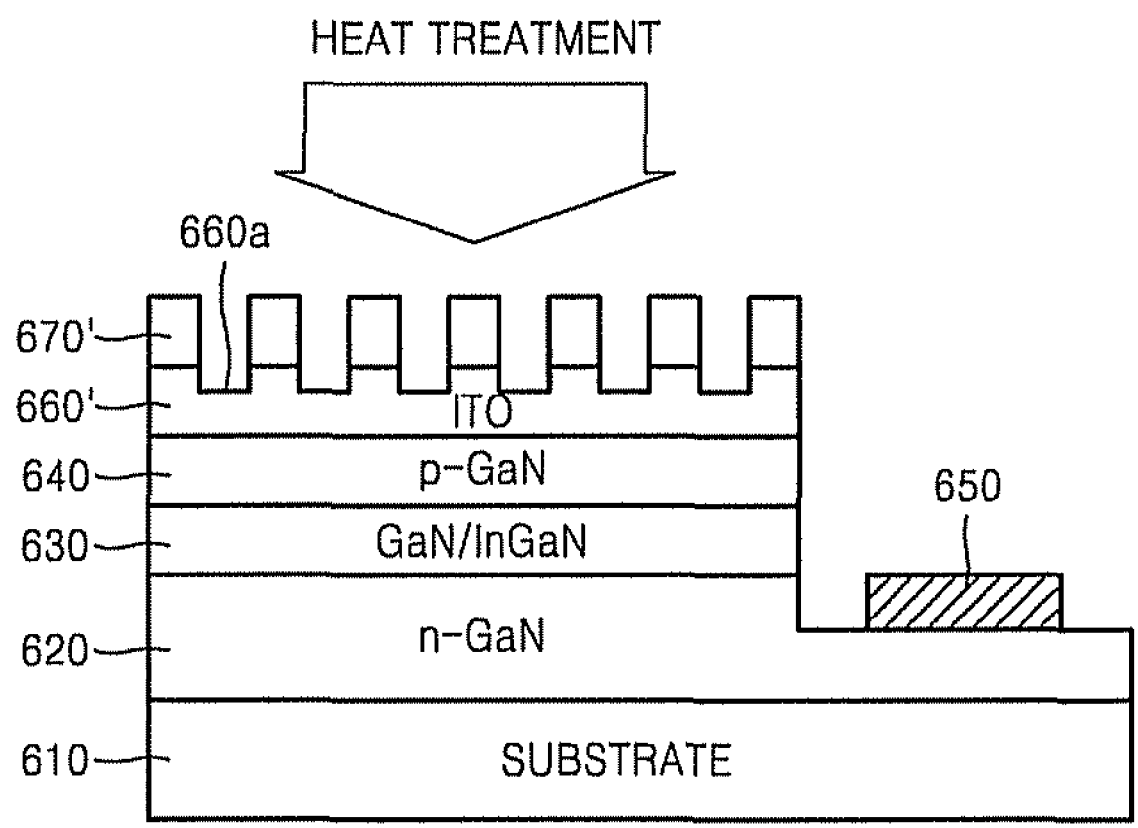
Figure 6H:
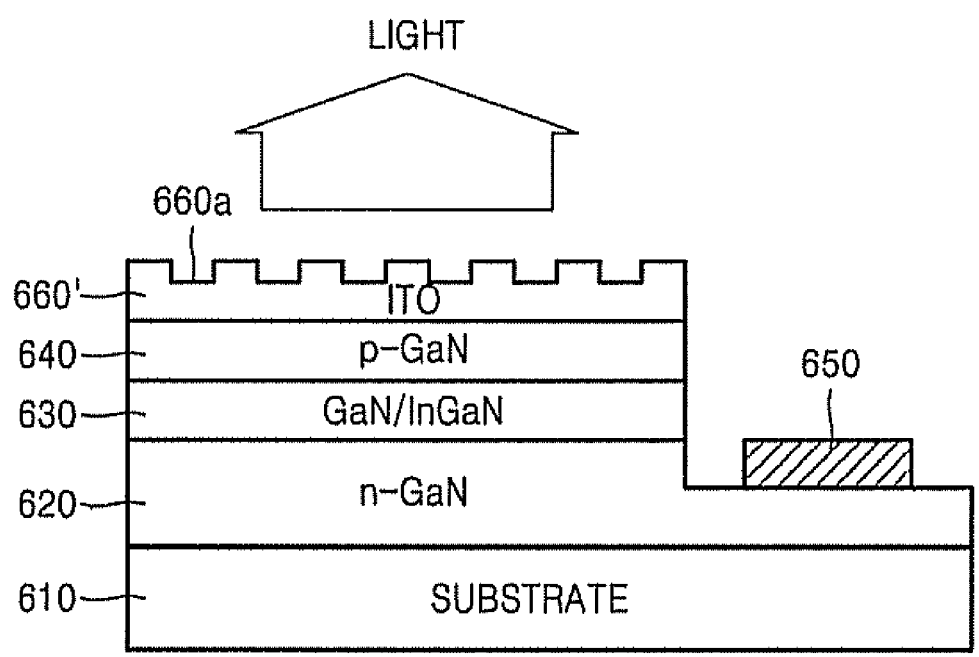
Figure 6H:
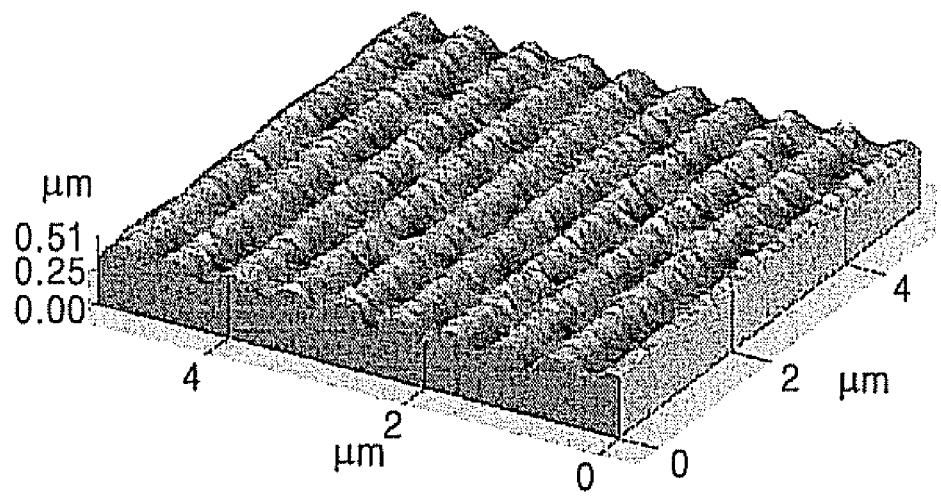

Referring to FIGS. 6G and 6H, the resulting layers are heat-treated at temperature between ambient temperature and 425° C. to decompose or remove the patterned azobenzene-functionalized polymer film 670'. The heat treatment may be performed for 1 through 12 hours, or alternatively, may include multilevel operations. In particular, the heat treatment includes: raising the temperature from ambient temperature to 100° C. over 30 minutes and maintaining for 1 hour; raising the temperature from 100° C. to 350° C. over 30 minutes and maintaining for 5 hours; and raising the temperature from 300° C. to 425° C. over 30 minutes and maintaining for 2 hours. By the heat treatment including multilevel operations, thermal damage, which occurs in the heat treatment for other material layers except the patterned azobenzene-functionalized polymer film 670', that is, the n-doped semiconductor layer 620, the active layer 630, the p-doped semiconductor layer 640, the n-electrode 650 and the patterned p-electrode 660', can be minimized.

In the method of manufacturing the nitride-based semiconductor light emitting device according to the current embodiment, nanopatterns of uneven plane 660a having a pattern dimension of 1 μm or less can be easily formed on the ITO layer 660. Thus, a nitride-based semiconductor light-emitting device having a photonic crystal structure can be manufactured, in which optical power and light extraction efficiency is be improved. The method disclosed herein is simple and easy, and can be reproduced repeatedly. Thus, when the method is used for manufacturing an element, the method is reliable. FIGS. 6H-a and 6H-b also illustrate an AFM micrograph of the nanopatterns 660a in perspective (FIG. 6H-a) and cross-section (FIG. 6H-b) views. FIG. 7 is a graph illustrating an output power according to an injection current in the nitride-based semiconductor light-emitting device manufactured using the method according to the current embodiment.

According to the present invention, fine patterned surface relief gratings having a pattern dimension of 1 μm or less can be reproduced repeatedly using a simple and easy method. Accordingly, nanopatterns having a pattern dimension of 1 μm or less can be easily formed using the method according to the present invention, whereas it is difficult to form the nanopatterns using a conventional lithographic method. In addition, when the method of forming the fine patterned surface relief gratings is used for manufacturing a nitride-based semiconductor light emitting device, the nitride-based semiconductor light emitting device has improved optical power and light extraction efficiency.

While the present invention has been particularly shown and described with reference to exemplary embodiments thereof, it will be understood by those of ordinary skill in the art that various changes in form and details may be made therein without departing from the spirit and scope as defined by the following claims.

What is claimed is:

1. A method of forming a fine pattern comprising:
    forming an azobenzene-functionalized polymer film on a surface of an etch layer;
    irradiating the azobenzene-functionalized polymer film with an interference laser beam to form a fine patterned azobenzene-functionalized polymer film having surface relief gratings by a photophysical mass transporting of the azobenzene-functionalized polymer;
    etching the etch layer where the patterned azobenzene-functionalized polymer film is an etching mask; and
    removing the patterned azobenzene-functionalized polymer film,
        wherein the removing the azobenzene-functionalized polymer film is performed using a heat treatment process at a temperature between ambient temperature and 425° C.,
        wherein the heat treatment process is performed in multiple stages, each of which involves raising temperature and maintaining the raised temperature, and
        wherein the heat treatment process includes
            raising the temperature from ambient temperature to 100° C. over 30 minutes and maintaining a temperature of 100° C. for 1 hour;
            raising the temperature from 100° C. to 350° C. over 30 minutes and maintaining a temperature of 350° C. for 5 hours; and
            raising the temperature from 300° C. to 425° C. over 30 minutes and maintaining a temperature of 425° C. for 2 hours.

2. The method of claim 1, wherein the azobenzene-functionalized polymer comprises a material having a weight averaged molecular weight of 1,000 to 500,000.

3. The method of claim 1, wherein the azobenzene-functionalized polymer comprises Poly Disperse Orange 3 (PDO3).

4. The method of claim 1, wherein the interference laser beam is a 488 nm emission line from an Ar laser.

5. The method of claim 1, wherein the fine pattern is formed to have a pattern dimension of 2 μm or less.

6. The method of claim 5, wherein the fine pattern is formed to have a period of 10 μm or less.

7. The method of claim 6, wherein the fine pattern is formed to have a pattern dimension of 1 μm or less.

8. The method of claim 1, wherein the fine pattern is formed to have a 1-D (one dimension) pattern, a 2-D (two dimension) pattern or a 3-D (three dimension) pattern.

9. A method of manufacturing a nitride-based semiconductor light emitting device comprising an n-doped semiconductor layer, an active layer, a p-doped semiconductor layer, an n-electrode and a p-electrode, the method comprising;
    forming an azobenzene-functionalized polymer film on an etch layer, wherein the etch layer is one selected from the group consisting of the n-doped semiconductor layer, the p-doped semiconductor layer, the n-electrode, and the p-electrode;
    irradiating the azobenzene-functionalized polymer film with an interference laser beam to form a fine patterned azobenzene-functionalized polymer film having fine patterned surface relief gratings by a photophysical mass transporting of the azobenzene-functionalized polymer;
    forming an uneven plane having a photonic crystal structure by etching the etch layer, where the patterned azobenzene-functionalized polymer film, on which the fine patterned surface relief gratings are formed is an etching mask; and
    removing the patterned azobenzene-functionalized polymer film
        wherein the removing the azobenzene-functionalized polymer film is performed using a heat treatment process at a temperature between ambient temperature and 425° C.,
        wherein the heat treatment process is performed in multiple stages, each of which involves raising temperature and maintaining the raised temperature, and wherein the heat treatment process includes
  raising the temperature from ambient temperature to 100° C. over 30 minutes and maintaining a temperature of 100° C. for 1 hour;
  raising the temperature from 100° C. to 350° C. over 30 minutes and maintaining a temperature of 350° C. for 5 hours; and
  raising the temperature from 300° C. to 425° C. over 30 minutes and maintaining a temperature of 425° C. for 2 hours.

10. The method of claim 9, wherein the azobenzene-functionalized polymer comprises a material having a molecular weight of 1,000 to 500,000.

11. The method of claim 9, wherein the azobenzene-functionalized polymer comprises Poly Disperse Orange 3 (PDO3).

12. The method of claim 9, wherein the interference laser beam is the 488 nm emission line of an Ar laser.

13. The method of claim 9, wherein the fine patterned surface relief gratings are formed to have a pattern dimension of 2 μm or less.

14. The method of claim 13, wherein the fine patterned surface relief gratings are formed to have a period of 10 μm or less.

15. The method of claim 14, wherein the fine patterned surface relief gratings are formed to have a pattern dimension of 1 μm or less.

16. The method of claim 9, wherein the fine patterned surface relief gratings are formed to have a one dimensional (1-D) pattern, a two dimensional (2-D) pattern, or a three dimensional (3-D) pattern.

17. The method of claim 9, wherein the n-electrode is formed of a transparent conductive oxide.

18. The method of claim 9, wherein the p-electrode is formed of a transparent conductive oxide.

* * * * *